US012568639B2

(12) United States Patent
Moore et al.

(10) Patent No.: US 12,568,639 B2
(45) Date of Patent: Mar. 3, 2026

(54) INSULATED GATE POWER DEVICE WITH EPITAXIALLY GROWN SUBSTRATE LAYERS

(71) Applicant: Pakal Technologies, Inc., San Francisco, CA (US)

(72) Inventors: Paul M. Moore, Hillsboro, OR (US); Vladimir Rodov, Seattle, WA (US)

(73) Assignee: Pakal Technologies, Inc., San Francisco, CA (US)

( * ) Notice: Subject to any disclaimer, the term of this patent is extended or adjusted under 35 U.S.C. 154(b) by 406 days.

(21) Appl. No.: 18/203,862

(22) Filed: May 31, 2023

(65) Prior Publication Data

US 2024/0405107 A1     Dec. 5, 2024

(51) Int. Cl.
*H10D 62/00*        (2025.01)
*H10D 12/00*        (2025.01)
*H10D 12/01*        (2025.01)
*H10D 62/13*        (2025.01)

(52) U.S. Cl.
CPC ......... *H10D 12/481* (2025.01); *H10D 12/038* (2025.01); *H10D 62/142* (2025.01)

(58) Field of Classification Search
CPC .. H10D 12/481; H10D 12/038; H10D 62/142; H10D 12/032; H10D 12/441; H10D 62/60
USPC ........................................ 257/139
See application file for complete search history.

(56) References Cited

U.S. PATENT DOCUMENTS

| | | | | |
|---|---|---|---|---|
| 2009/0212321 A1* | 8/2009 | Hsieh | ................... | H10D 12/481 |
| | | | | 438/138 |
| 2009/0283796 A1* | 11/2009 | Udrea | .................. | H10D 12/481 |
| | | | | 257/E29.198 |
| 2012/0126310 A1* | 5/2012 | Yin | .................... | H10D 84/0135 |
| | | | | 257/E21.409 |
| 2013/0313640 A1* | 11/2013 | Shen | .................... | H10D 30/025 |
| | | | | 257/E29.256 |
| 2014/0357050 A1* | 12/2014 | Feng | ................. | H01L 21/76229 |
| | | | | 438/430 |
| 2015/0221731 A1* | 8/2015 | Zeng | .................... | H10D 30/668 |
| | | | | 257/329 |
| 2016/0118586 A1* | 4/2016 | Wu | .................... | H10N 70/8833 |
| | | | | 438/382 |
| 2016/0307805 A1* | 10/2016 | Lai | .................... | H01L 21/28088 |
| 2016/0351690 A1* | 12/2016 | Hsu | ....................... | H10D 30/603 |

(Continued)

*Primary Examiner* — Sheikh Maruf
(74) *Attorney, Agent, or Firm* — Patent Law Group; Brian Ogonowsky

(57)        ABSTRACT
A method of forming a layered, high power vertical insulated-gate switch uses an n-type substrate. A p-well is formed by implantation in the top surface of the substrate followed by implanting n-type dopants in the p-well to form n+ source regions. Trenched gates are formed extending through the n+ source regions and into the p-well. The wafer is transferred to a carrier and the bottom surface of the wafer substrate is thinned by CMP. An n-buffer layer is then epitaxially grown on the bottom surface using low temperature epitaxy (LTE). The low temperature does not substantially diffuse the dopants in the overlying regions. A bottom p+ layer is then formed by LTE. Anode and cathode metal electrodes are then formed. The n-buffer layer and p+ layers can be precisely formed for optimal efficiency and the LTE maintains the dopant profiles of the overlying regions.

14 Claims, 4 Drawing Sheets

(56) References Cited

U.S. PATENT DOCUMENTS

| | | | |
|---|---|---|---|
| 2018/0212030 A1* | 7/2018 | Wu | H10D 62/151 |
| 2019/0157448 A1* | 5/2019 | Takashima | H01L 21/3245 |
| 2020/0303498 A1* | 9/2020 | Poelzl | H10D 30/66 |
| 2021/0202737 A1* | 7/2021 | Pan | H10D 30/657 |

* cited by examiner

675μ

Starting substrate n-

40

INSULATED GATE POWER DEVICE WITH EPITAXIALLY GROWN SUBSTRATE LAYERS

FIELD OF THE INVENTION

This invention relates to high power, insulated-gate-controlled devices used as switches and, more particularly, to a technique to increase control of dopant diffusion, reduce crystalline defects, and improve performance.

BACKGROUND

An example of a prior art insulated gate turn-off device (IGTO device), from U.S. Pat. No. 10,181,509, is shown in FIG. 1 to illustrate a problem with conventional fabrication techniques. U.S. Pat. No. 10,181,509 is incorporated herein by reference.

The structure in FIG. 1 is a "field stop" structure because of the presence of an n-type buffer layer between the relatively thick n-drift layer and the p+ layer (the starting wafer substrate). This field stop layer causes the electric field in the n-drift layer to decrease rapidly near the p+ layer. For optimal performance, the structure of the field stop device requires a thin bottom p+ layer with a precisely controlled dopant profile.

The details of the FIG. 1 device's operation are not important but are presented below for completeness. The present invention primarily deals with fabrication methods relating to the portion of the substrate that is connected to, or close to, the "bottom" anode metal, so the invention can apply to many other types of vertical switches. This portion includes the n-buffer layer and the p+ layer.

Prior art FIG. 1 is a cross-section of a small portion of an IGTO device 10 (similar in some respects to a thyristor). The portion is near an edge of the device and shows a plurality of cells having vertical gates 12 (e.g., doped polysilicon) formed in insulated trenches. A 2-dimensional array of the cells may be formed in a common p-well 14, and the cells are connected in parallel. The area containing the cells is shown as the active region 15. The edge of the device suffers from field crowding, and the edge cell is modified to increase ruggedness of the device. The edge cell has an opening 16 in the n+ source region 18 where the cathode electrode 20 shorts the n+ source region 18 to the p-well 14. Such shorting increases the tolerance to transients to prevent unwanted turn on and prevents the formation of hot spots. A p+ contact (not shown) may be used at the opening 16 of the edge cell for improved electric contact to the p-well 14. The configuration of the edge cell may also be used in other cells of the device for a more uniform current flow across the device.

The vertical gates 12 are insulated from the p-well 14 by an oxide layer 22. The narrow gates 12 are connected together outside the plane of the drawing and are coupled to a gate voltage via the gate electrode 25 contacting the polysilicon portion 28. A patterned dielectric layer 26 insulates the metal from the various regions.

The field limiting rings 29 at the edge of the cell in the termination region 27 reduce field crowding for increasing the breakdown voltage. The termination region 27 is designed to break down at a voltage higher than the breakdown voltage of the active region 15, since the cathode electrode 20 is over the active region 15 and can efficiently conduct the breakdown current. The termination region 27 surrounds the active region 15, which may have a generally rectangular shape. The active region 15 may take up the center area of a die or may be formed in strips separated by termination regions 27.

An npnp semiconductor layered structure is formed in FIG. 1. There is a bipolar pnp transistor formed by a starting p+ substrate 30, an n-epitaxial (epi) layer 32, and the p-well 14. There is also a bipolar npn transistor formed by the n-epi layer 32, the p-well 14, and the n+ source region 18. An n-type buffer layer 35, which may be epitaxially grown or formed by implantation into the substrate 30, has a dopant concentration higher than that of the n-epi layer 32. The buffer layer 35 helps to set the breakdown voltage and reduces hole injection into the n-epi layer 32. A metal anode electrode 36 contacts the substrate 30, and a metal cathode electrode 20 contacts the n+ source region 18. The p-well 14 surrounds the gate structure, and the n-epi layer 32 extends to the surface around the p-well 14.

When the anode electrode 36 is forward biased with respect to the cathode electrode 20, but without a sufficiently positive gate bias, there is no current flow, since the product of the betas (gains) of the pnp and npn transistors is less than one (i.e., there is no regeneration activity).

When the gate is forward biased, electrons from the n+ source region 18 become the majority carriers along the gate sidewalls in an inversion layer, referred to as a "voltage induced emitter," causing the effective width of the npn base (the portion of the p-well 14 between the n-layers) to be reduced. As a result, the beta of the npn transistor increases to cause the product of the betas to exceed one. This condition results in device turn-on, with holes being injected into the lightly doped n-epi layer 32 and electrons being injected into the p-well 14. Accordingly, the gate bias initiates the turn-on, and the full turn-on (due to regenerative action) occurs when there is current flow through both the npn transistor and the pnp transistor.

When the gate bias is removed, such as the gate electrode 25 being shorted to the cathode electrode 20, the IGTO device turns off.

The prior art fabrication technique is fairly conventional. In one process embodiment, a starting p+ type substrate 30 has the n-buffer layer 35 and the n-epi layer 32 epitaxially grown over its surface using a standard, high temperature epitaxy process, such as exceeding 1000° C.

The p-well 14 is formed in the upper surface by masking and implantation of p-type dopants. The n+ source regions 18 are implanted, and the trenches are etched, oxidized, and filled with doped polysilicon. A high temperature anneal, typically greater than 1000° C., is used to activate the implanted dopants and reduce the crystalline damage caused by the implantation. The top surface is masked and the cathode metal 20 is formed. The p+ substrate 30 is then thinned from the bottom, and the anode metal 36 is formed.

The various high temperature steps diffuse the dopants upwards and downwards to make the various region boundaries fairly imprecise and somewhat variable.

Therefore, what is needed is a fabrication technique that avoids one or more of the high temperature steps described above so that the various regions and boundaries are more precise and repeatable.

SUMMARY

The present invention applies to many different types of vertical switches having gate-controlled layers over a starting substrate. A trenched gate device will be described in the example.

In one embodiment, an n-type starting substrate is used, having a conventional thickness on the order of 675 microns. The n-type substrate forms the thick depletion layer below the trenches. The p-well, the trenches, the n+ source regions, and the other upper layers may be formed over the substrate in a conventional way, such as by implantation and etching. The top cathode electrode is then formed.

The resulting structure is then supported in a carrier so that the backside of the wafer is exposed for thinning using CMP. The n-substrate is then thinned to about 50-60 microns for a 650 volt device.

A low temperature epitaxy (LTE) process is then used to grow the n-buffer layer, which has a dopant concentration higher than that of the n-type substrate, followed by another LTE process for growing the p+ layer on the bottom of the device. An LTE process is typically less than 600° C. and as low as 250° C. Since the bottom surface epitaxial regions are grown while doping, there is no additional implantation, so no high temperature steps are used for annealing. The LTE steps result in very little additional diffusion of dopants in the remainder of the device, so the various regions are more precisely defined. Further, having a precise thin p+ layer on the bottom results in a more efficient emitter layer and improves the performance of the overlying field stop layer (an n-buffer layer). Still further, since there is no implantation into the bottom surface, there is no crystal damage, which further improves performance. Still further, the cathode electrode metal interface with the n+ source regions is not adversely affected by the low LTE temperature.

The bottom anode is then formed over the p+ bottom surface. The top cathode electrode may be formed over the n+ source regions before or after the LTE processes.

In another embodiment, the n-buffer layer is formed by LTE on the back surface, and the bottom p+ layer is formed by ion implantation from the back side. The p+ layer is then annealed using a laser so that only the back surface is rapidly heated rather than the entire device. Therefore, there is no additional dopant diffusion in the upper layers.

The resulting structure has improved operating characteristics, and the performance is more repeatable from lot to lot.

The techniques may be used with many different types of cellular arrays in vertical insulated-gate devices, such as IGBT devices and IGTO devices. The layers may be npnp or pnpn. The gates may be trenched gates or lateral surface gates.

BRIEF DESCRIPTION OF THE DRAWINGS

Elements that are the same or equivalent are labelled with the same numerals.

DETAILED DESCRIPTION

The invention is directed to an improved process for forming the bottom portion of vertical switches using npnp or pnpn layers. In the example, the new process will be used to form an IGTO device similar to that of FIG. 1, but many other types of devices, such as IGBTs and thyristors may be formed.

Figure 2:
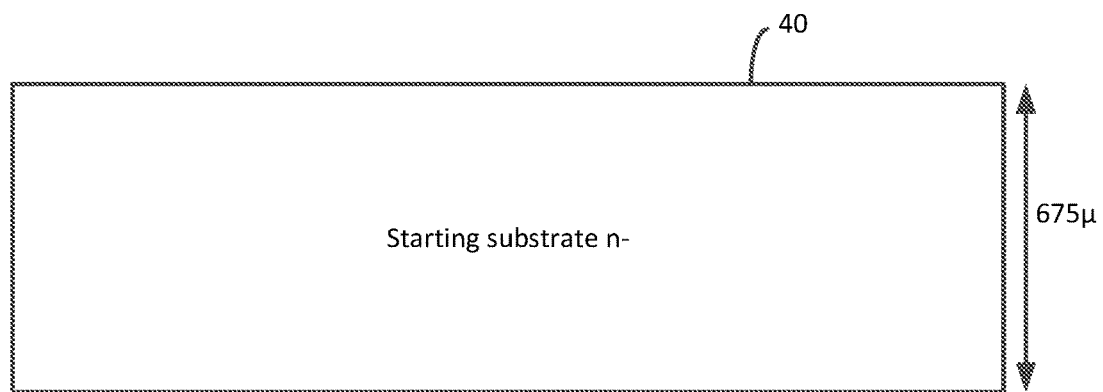
FIG. 2 is a cross-sectional view of a starting substrate in accordance with one embodiment of the invention.

FIG. 2 is a cross-section of a small portion of a starting n-type silicon substrate 40, which will be later singulated to form dies. The wafer may be 200 mm in diameter. A conventional starting thickness of the substrate 40 is about 675 microns, which provides sufficient mechanical strength during manipulation of the substrate 40. The dopant concentration of the substrate 40 is that needed for a thick depletion layer in the vertical switch to withstand a cathode-anode operating voltage on the order of 600 volts.

Figure 1:
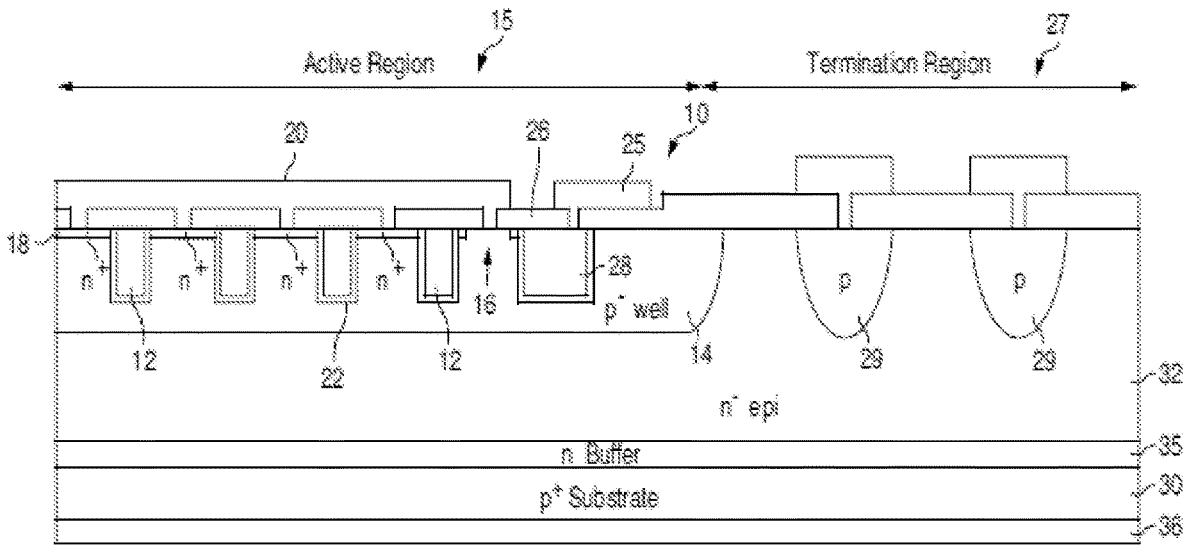
FIG. 1 is a cross-sectional view of the assignee's prior art vertical insulated-gate switch, formed as a die, from U.S. Pat. No. 10,181,509.
Figures 3, 4, 5:
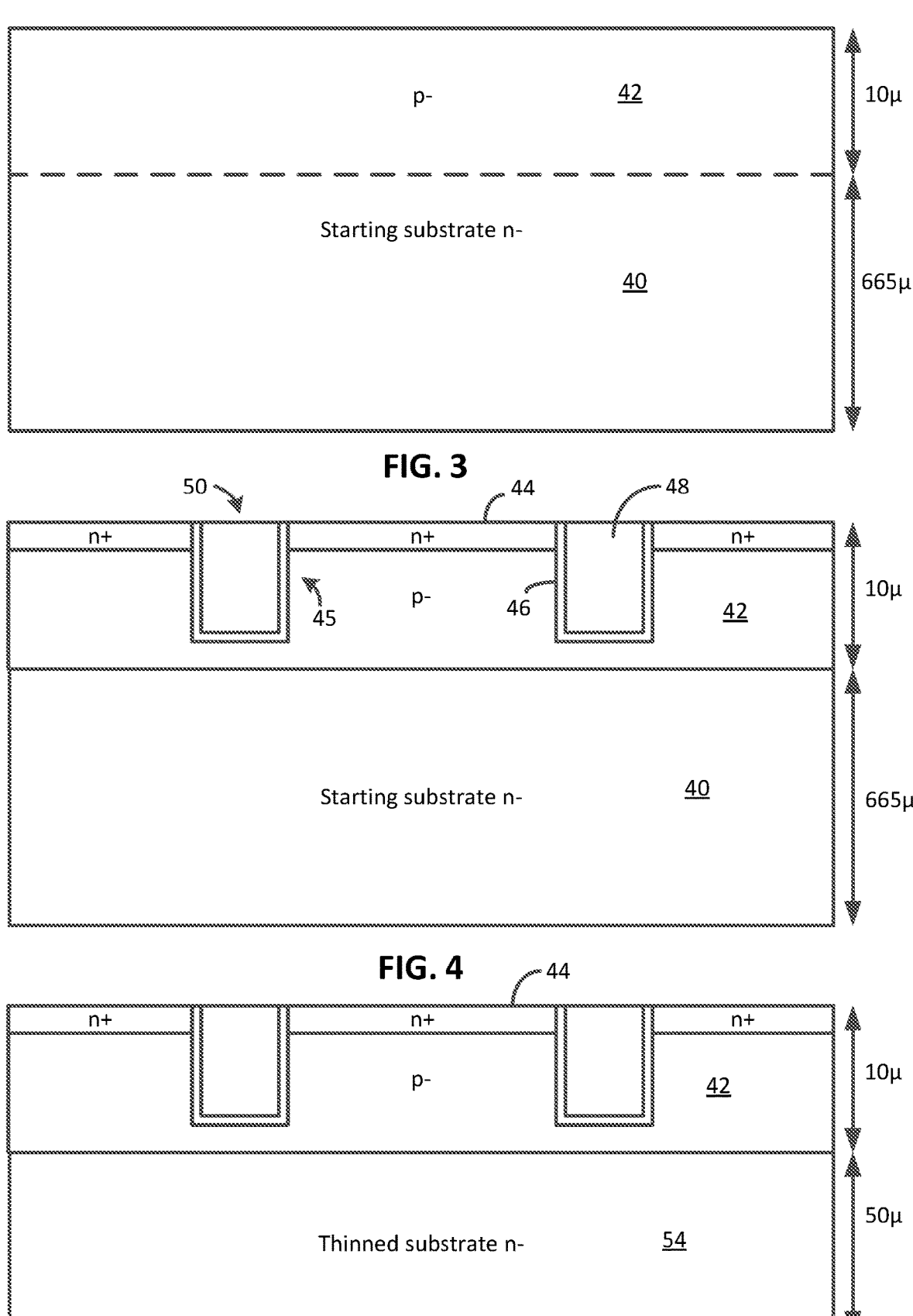
FIG. 3 illustrates a p-layer implanted in the top surface of the substrate or epitaxially grown over the substrate, for forming a p-well.
FIG. 4 illustrates the formation of an n+ source region layer and oxidized trenches filled with a conductive doped polysilicon.
FIG. 5 illustrates the backside thinning of the substrate using chemical-mechanical-polishing (CMP) after the wafer is installed in a carrier.

FIG. 3 illustrates the implantation of p-type dopants into the top surface of the substrate 40 to form a p-well 42, which may be similar to the p-well 14 in FIG. 1. In one embodiment, the implant will form a p-well 42 about 10 microns thick. Other thicknesses are contemplated and depend on the desired characteristics of the device. The p-well 42 may be patterned using a conventional masking step. The p-well 42 may be considered a p-type layer since it may also be continuous across the die.

The p-type dopants are then diffused at a high anneal temperature, such as greater than 1000° C., which activates the dopants and repairs the implant damage in the silicon.

In FIG. 4, the top surface is masked, and n-type dopants are implanted to form the n+ source regions 44. The n-type dopants are then diffused at a high anneal temperature, such as greater than 1000° C., which activates the dopants and repairs the implant damage in the silicon.

The top surface is masked to define the locations of the trenched gates. The exposed surface is then etched using reactive ion etching (RIE) to form the trenches 45, which may be on the order of 6-8 microns deep. The trenches 45 are oxidized to form gate oxide 46, and the insulated trenches 45 are filled with a conductive doped polysilicon 48 to form an array of gates 50. Each trench area forms a cell in an array of cells, where all the cells are connected in parallel and operate similarly.

These upper layers may be conventional. Instead of trenched gates, the gates may be lateral and separated from a p-type channel region by thin gate oxide.

A metal, top cathode electrode (shown later) may be formed now or at a later stage.

In FIG. 5, the wafer is mounted in a carrier to expose its bottom side. The substrate is then ground down and polished using CMP to approximately 50-60 microns to form a thinned substrate 54. The thickness depends on the desired operating voltage. Generally, the thickness of the n-layer between the p-well 42 and an n-buffer layer should be about 10 microns for every 100 volts. In the example, the thickness of the thinned substrate 54 is 50-60 microns for a 600 volt device.

In one embodiment, the grinding and polishing form a thinned center area with a much thicker edge area of the circular wafer. This is referred to as a Taiko process. This technique preserves some of the mechanical robustness of the wafer during processing while thinning the areas where devices are formed.

Figure 6:
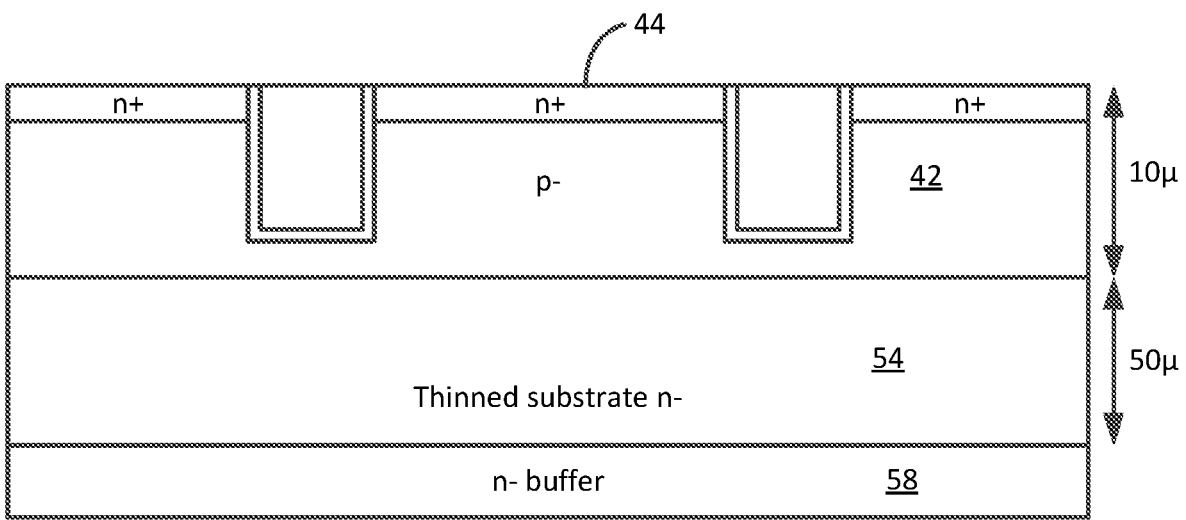
FIG. 6 illustrates the low temperature epitaxy (LTE) growth of an n-buffer layer on the backside surface of the thinned substrate.

In FIG. 6, an n-buffer layer 58 is epitaxially grown on the exposed surface using LTE.

This may be performed at temperatures between 600-250° C., which is low enough to not substantially diffuse dopants in the upper portion of the device. Therefore, the dopant profiles remain relative fixed. The n-buffer layer 58 is doped while growing so that it has a dopant concentration higher than that of the thinned n-type substrate 54. The n-buffer layer 58 is referred to as a field stop layer.

The n-buffer layer 58 helps to set the breakdown voltage and reduces hole injection into the thinned substrate 54. The thickness of the n-buffer layer 58 may be a few microns, such as less than 10 microns.

LTE processes for epitaxially growing silicon are well known. Some examples of LTE are described in U.S. Pat. No. 9,231,094 and the article entitled, Silicon Epitaxy on H-Terminated Si (100) Surfaces at 250° C., by Xiao Deng et al., Appl Surf Sci., Aug. 15, 2016, pages 301-307, both incorporated herein by reference.

Figure 7:
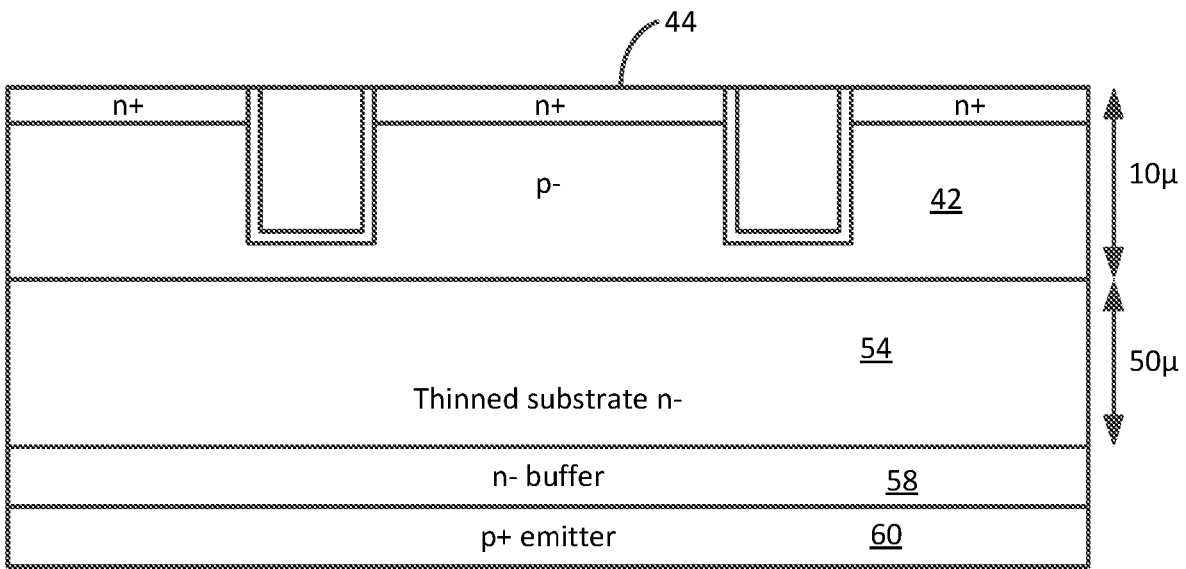
FIG. 7 illustrates the low temperature epitaxy (LTE) growth of a p+ layer on the backside surface of the thinned substrate.

In FIG. 7, a p+ layer 60 is grown using LTE on the bottom surface of the thinned substrate 54. As with the n-buffer layer 58, the low temperature does not substantially affect the dopant profiles of the upper layers. The p+ layer 60 may have a p-type dopant concentration greater than 10E19 $cm^{-3}$. The p+ layer 60 may have a thickness of a few microns, such as less than 10 microns, and serves as an emitter of the vertical pnp transistor. A thin and precisely formed p+ layer 60 is advantageous for reducing on-resistance, for allowing excess carriers to be rapidly removed from the device during turn-off, and for optimizing the performance of the field stop layer (n-buffer layer 58).

By using LTE, the p+ layer 60 may be formed to be thinner than using implantation. By forming a thin p+ layer 60, carriers in the thick n-layer between the p-well 42 and the n-buffer layer 58 may be removed, when the device is turned off, by direct transport through the p+ layer 60 to the anode electrode. This adds improved efficiency. The absence of crystalline defects due to implantation also improves efficiency.

Figure 8:
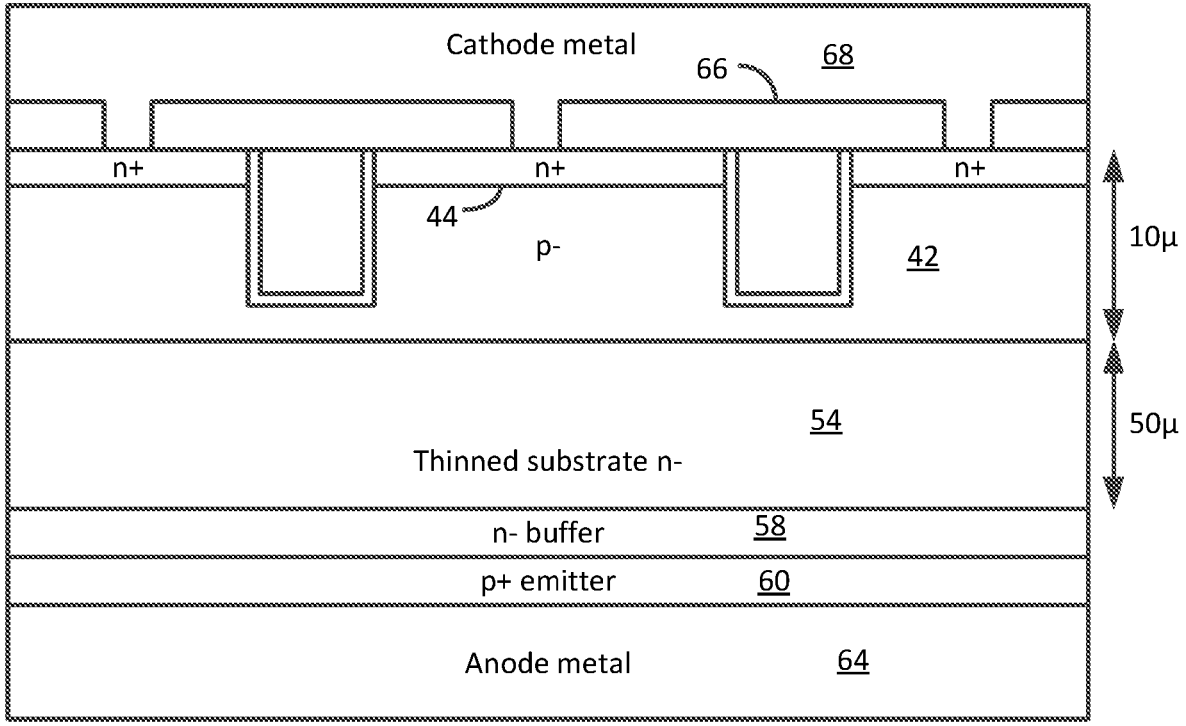
FIG. 8 illustrates the formation of the cathode and anode electrodes and top dielectric regions to insulate the cathode metal from the gates.

In FIG. 8, the bottom metal anode electrode 64 is formed on the p+ layer 60. The top surface is then masked with a dielectric 66, and a top metal cathode electrode 68 is formed to contact the n+ source regions 44.

The wafer is then diced, and the dies are packaged to form the vertical switches.

Due to the reduced diffusion of dopants, by using the LTE processes, a higher density of cells may be formed to further improve efficiency.

The completed die will be a vertical insulated-gate switching device, such as an IGBT or an IGTO device. In the example, the trenched gates terminate within the p-well 42. However, the gates may terminate below the p-well 42 to create an n-type conductive path between the n+ source regions 44 and the n-type thinned substrate 54 when the device is turned on to form a different type of vertical switch.

Simulations may be used for determining the optimal region depths, dopant concentrations, and dosages.

Opposite conductivity type devices are formed by making dopant types the opposite of those describe above. Thus, the bottom of the device may be the cathode.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming an insulated-gate switching device comprising:

providing an n-type substrate having a first n-type dopant concentration, the substrate having a top surface and a bottom surface;

doping the top surface with p-type dopants to form a first p-type layer;

forming an array of insulated gates;

forming n-type source regions overlying at least portions of the first p-type layer;

thinning the bottom surface of the substrate;

using a low temperature epitaxy (LTE) process to form an n-type buffer layer on the bottom surface of the substrate, where the n-type buffer layer has a dopant concentration that is greater than the first dopant concentration of the n-type substrate;

using an LTE process to form a second p-type layer on the n-type buffer layer;

forming an anode electrode on the second p-type layer; and forming a cathode electrode electrically connected to the n-type source regions.

2. The method of claim 1 wherein the LTE process forms the n-type buffer layer and the second p-type layer at a temperature of less than 600° C.

3. The method of claim 1 wherein the step of thinning the bottom surface of the substrate thins the substrate to less than 100 microns.

4. The method of claim 1 wherein the step of forming the array of insulated gates comprises:

forming trenches at least within the first p-type layer;

insulating walls of the trenches; and at least partially filling the trenches with a conductive material.

5. The method of claim 4 wherein the trenches terminate within the first p-type layer.

6. The method of claim 4 wherein the trenches extend below the first p-type layer.

7. The method of claim 1 wherein the first p-type layer forms a well region.

8. The method of claim 1 wherein the method forms an insulated gate turn off device.

9. The method of claim 1 wherein the method forms an insulated gate bipolar transistor.

10. The method of claim 1 wherein the step of forming the array of insulated gates comprises forming an array of vertical gates.

11. The method of claim 1 wherein the step of forming the cathode occurs prior to thinning the bottom surface of the substrate.

12. The method of claim 1 wherein the step of doping the top surface substrate with p-type dopants to form the first p-type layer comprises implanting p-type dopants and then annealing the top surface of the substrate.

13. The method of claim 1 wherein the step of forming n-type source regions overlying at least portions of the first p-type layer comprises implanting n-type dopants in the first p-type layer and then annealing the top surface of the substrate.

14. The method of claim 1 wherein the n-type buffer layer and the second p-type layer are each less than 10 microns thick.

* * * * *